(12) United States Patent
Novak et al.

(10) Patent No.: US 6,863,836 B2
(45) Date of Patent: Mar. 8, 2005

(54) METHOD FOR REMOVAL OF PHOTORESIST USING SPARGER

(75) Inventors: Richard Novak, Plymouth, MN (US); Ismail Kashkoush, Orefield, PA (US)

(73) Assignee: Akrion, LLC, Allentown, PA (US)

( * ) Notice: Subject to any disclaimer, the term of this patent is extended or adjusted under 35 U.S.C. 154(b) by 0 days.

(21) Appl. No.: 10/634,440

(22) Filed: Aug. 5, 2003

(65) Prior Publication Data

US 2004/0035442 A1 Feb. 26, 2004

Related U.S. Application Data

(62) Division of application No. 10/052,823, filed on Jan. 17, 2002, now Pat. No. 6,649,018.

(51) Int. Cl.[7] ............................ B44C 1/22; C03C 15/00; C03C 25/68; C23F 1/00; H01L 21/302; H01L 21/461
(52) U.S. Cl. .............................. 216/93; 216/83; 438/689
(58) Field of Search ............................ 438/689; 216/83, 216/93

(56) References Cited

U.S. PATENT DOCUMENTS

| | | |
|---|---|---|
| 5,464,480 A | 11/1995 | Matthews |
| 6,080,531 A | 6/2000 | Carter et al. |
| 6,187,216 B1 | 2/2001 | Dryer et al. |

FOREIGN PATENT DOCUMENTS

JP 2000164552 A * 6/2000 ......... H01L/21/304

* cited by examiner

*Primary Examiner*—Gregory Mills
*Assistant Examiner*—Maureen G. Arancibia
(74) *Attorney, Agent, or Firm*—Cozen O'Connor, P.C.; Michael B. Fein, Esq.; Brian L. Belles, Esq.

(57) ABSTRACT

A method of removing photoresist from semiconductor wafers through the use of a sparger plate. According to the inventive method, at least one semiconductor wafer is positioned in a process tank above the sparger plate. A mixture of ozone and deionized water is introduced into the process tank at a position below the sparger plate. The mixture of ozone and deionized water is then introduced across the wafer via the sparger plate at an increased flow velocity while the wafer is submerged in the mixture of deionized water and ozone.

7 Claims, 1 Drawing Sheet

METHOD FOR REMOVAL OF PHOTORESIST USING SPARGER

CROSS-REFERENCE TO RELATED APPLICATION

This application is a divisional application of Ser. No. 10/052,823 filed Jan. 17, 2002. now U.S. Pat. No. 6,649,018. All applications are hereby incorporated by reference in their entireties.

FIELD OF THE INVENTION

This invention relates to the field of manufacturing silicon semiconductors, more specifically to processes and apparatus for removing photoresist from the surfaces of silicon semiconductor wafers during such manufacturing.

BACKGROUND OF THE INVENTION

The importance of clean semiconductor workpiece surfaces in the fabrication of semiconductor microelectronic devices has been recognized for a considerable period of time. Over time, as VLSI and ULSI silicon circuit technology has developed, the cleaning processes have gradually become a particularly critical step in the fabrication process. Trace impurities, such as sodium ions, metals, and particles, are especially detrimental if present on semiconductor surfaces during high-temperature processing because they may spread and diffuse into the semiconductor workpiece and thereby alter the electrical characteristics of the devices formed in the workpiece.

The actual stripping of photoresist from the workpiece is yet another fabrication process that is important to integrated circuit yield, and the yield of other workpiece types. It is during the stripping process that a substantial majority of the photoresist is removed or otherwise disengaged from the surface of the semiconductor workpiece. If the stripping agent is not completely effective, photoresist may remain bonded to the surface. Such bonded photoresist may be extremely difficult to remove during a subsequent cleaning operation and thereby impact the ability to further process the workpiece.

In order to produce a useful semiconductor wafer, first a silicon crystal is grown and then sliced into thin wafers. The thin wafers are then exposed to a photoresist which forms a layer on the wafers. Selected areas of the photoresist are exposed to light, which cures those areas. The remaining unexposed areas of photoresist are then etched off to form patterns on the wafers. Lastly, the wafers are cleaned.

There have been many attempts at improving the speed and efficiency of the removal of the photoresist. For example, Matthews, U.S. Pat. No. 5,776,296, discloses a process for removing photoresist from a semiconductor wafer by diffusing ozone ($O_3$) into a bath of deionized water (DI) at sub-ambient temperatures of 1 to 15° C. to form a mixture ($DIO_3$). However, the Matthews system and process suffers from certain disadvantages, most especially the low rate of removal of photoresist, as well as a requirement to chill the DI water with a chiller.

It is an object of the present invention to provide a faster and more efficient process of removal of photoresist from a silicon semiconductor wafer than any available in the prior art.

It is another object of the invention to provide an improved apparatus for use in the process which results in and efficient and fast method of removing photoresist from silicon semiconductor wafers.

SUMMARY OF THE INVENTION

These objects, and others which will become apparent from the following detailed description and drawings, are achieved by the present invention which comprises in one aspect applying pressure in excess of one atmosphere to $O_3$; mixing the $O_3$ with DI via a sparger plate to form $DIO_3$; and exposing semiconductor wafers having at least one layer of photoresist to said $DIO_3$.

In another aspect the invention comprises an apparatus for the removal of photoresist from semiconductor wafers comprising a tank capable of holding semiconductor wafers; a sparger plate set within the tank; a source of $O_3$ connected to the tank; a source of DI connected to the tank; and a means for recirculating the DI.

The DI water is maintained at ambient or higher temperatures rather than below ambient temperature required by the prior art.

The $O_3$ is mixed with the DI water so that a high level or concentration of $O_3$ is present, resulting in $DIO_3$ water.

It has been found that the agitation of the $DIO_3$ via a sparger plate increases the velocity of the $DIO_3$ water and therefore raises the rate of photoresist removal, and thus subambient temperatures are not necessary or desirable. The strip rate for photoresist treated with $DIO_3$ water is linked to the velocity rate of the $DIO_3$ water. Notably, an increase in the fluid velocity reduces the boundary layer thickness, thereby resulting in a higher rate of $O_3$ oxidizing the photoresist, also known as "the etching rate." In addition, the optional use of sonic energy also reduces the boundary layer thickness, again resulting in a higher rate of $O_3$ oxidizing the photoresist or etch rate. Thus, the higher the kinetic energy and $O_3$ concentration, the shorter the strip time.

The etching rate of photoresist utilizing a solution of $O_3$ in DI water increases linearly with the increase in $O_3$ concentration. The apparatus of the invention, comprising the sparger, increases the velocity rate of the $DIO_3$ water so as to reduce the boundary layer thickness and therefore increase the rate of etching.

The method of the invention significantly increases the $O_3$ concentration in a DI water solution compared to the methods known in the prior art. The wafers may be placed directly into a tank containing ambient temperature or warmed ozonated water or, preferably, the wafers are placed in a tank of ambient temperature or higher deionized water and ozone is diffused into the tank. Preferably, the ozone is diffused into the water solution for a time sufficient to oxidize substantially all of the organic materials on the wafers. The amount of time needed for diffusion of the ozone into the water will depend on the nature of the organic material being removed and the amount of that material. The specific temperature of the water bath will also affect the time for diffusion of ozone since the amount of absorption of ozone into the water is dependent on the temperature and the oxidation power of the water solution is dependent on the amount of ozone absorbed.

Generally, the ozone will be diffused into the deionized water for about 1 to about 15 minutes. In a preferred embodiment, the ozone is diffused into the deionized water for about 5 to about 10 minutes.

According to the invention process for removing photoresist from semiconductor wafers, pressure in excess of one atmosphere is applied to ozone, the ozone is mixed with deionized water via a sparger plate, and the semiconductor wafers having at least one layer of photoresist are exposed to the mixture of ozone and deionized water.

Preferably the mixture of deionized water and ozone is recirculated and ozone added so that the concentration of ozone in the mixture is about constant.

The mixture of deionized water and ozone is agitated by the sparger plate.

The temperature of the solution of ozone in deionized water in the process tank is preferably above 20–21° C. according to the invention.

The apparatus for removing photoresist from semiconductor wafers comprises a tank capable of holding semiconductor wafers, a sparger plate within the tank, a source of ozone connected to the tank, a source of deionized water connected to the tank, and finally a means for recirculating the deionized water. The apparatus further comprises a pressure plenum connected to the source of ozone. The sparger plate is preferably located on the bottom of the process tank. The means for recirculating the deionized water is preferably connected to the source of the ozone. The means for recirculating the deionized water is preferably connected to a pressure plenum. The apparatus may include a temperature controller which keeps the temperature of the process liquid, $DIO_3$, at or above ambient temperature, most preferably at or above 20–21° C.

DETAILED DESCRIPTION OF THE INVENTION

Figure 1:
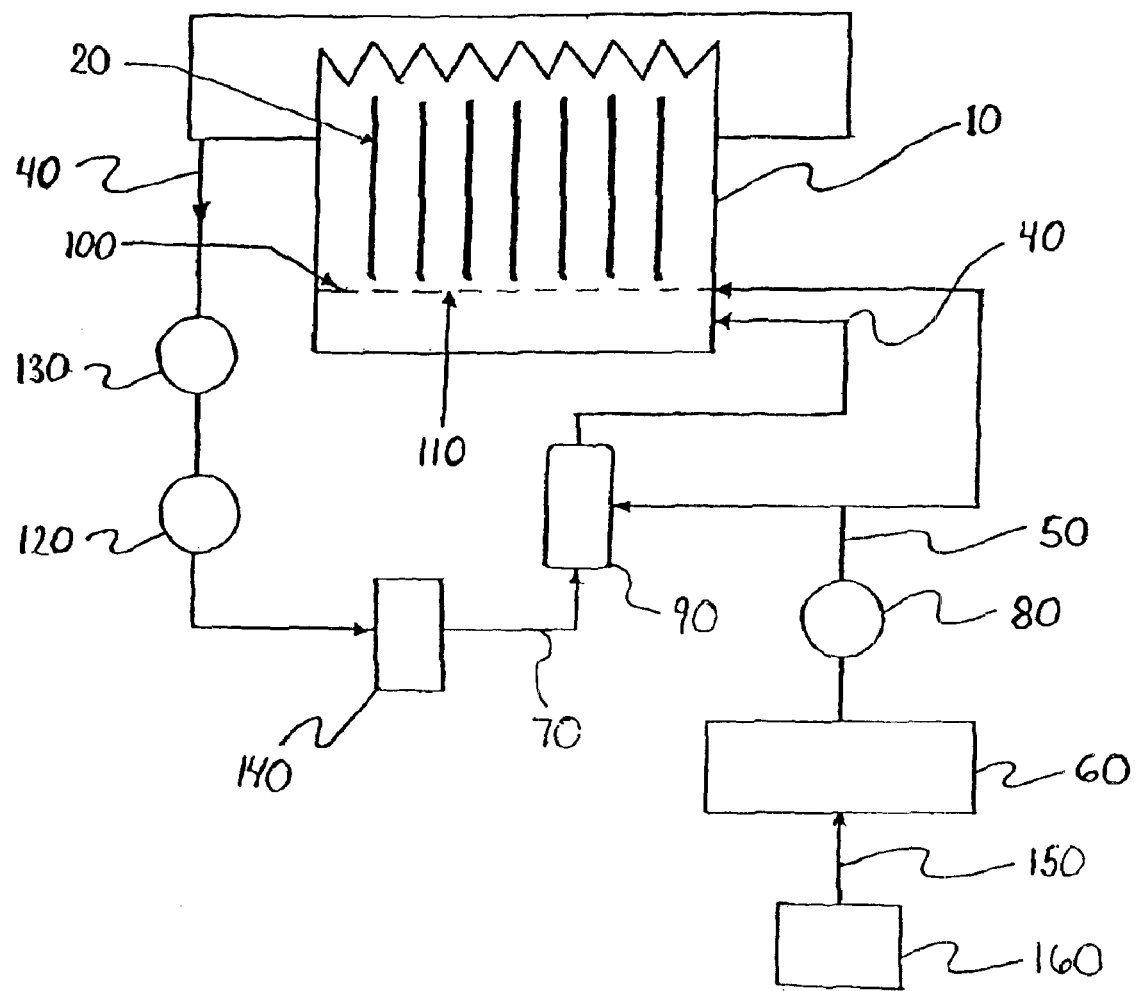
FIG. 1 is a schematic diagram of a photoresist stripping apparatus according to the invention.

According to the invention, an apparatus is disclosed which includes cassettes filled with semiconductor wafers having a layer or multi-layers of photoresist wherein the semiconductor wafers are exposed to pressurized $DIO_3$ water at ambient temperatures and with a velocity produced by a sparger plate so as to etch or remove the photoresist at a higher rate than previously known.

Preferably the process tank containing the silicon wafers from which photoresist is to be removed or etched contains a fixed amount of DI water at ambient or higher temperature. $O_3$ is generated with a generator. A portion is directed to a pressurized ozonator where it is mixed with DI water and then introduced into the process tank through the sparger, and another portion of the $O_3$ is introduced directly to the sparger plate.

The $DIO_3$ flows from the tank through a sensor, then to a pump, a filter, to the ozonator where it is pressurized, and then back to the pressurized plenum (sparger) at the bottom of the process tank. There are fill tubes at the bottom of the tank so as to provide the highest fluid velocity at the wafer surface. The $O_3$ is generated from the generator and fed to a sparger plate in the bottom of the tank and also to another ozonator where the $O_3$ gas is mixed with the DI. The concentration level of the gaseous and dissolved $O_3$ is monitored using inline ozone analyzers.

Referring now to FIG. 1, a schematic representation of an embodiment of the invention illustrates a process tank 10 which holds semiconductor wafers 20 in a cassette (not shown). The semiconductor wafers 20 have a layer or multiple layers of photoresist baked onto them. The semiconductor wafers 20 are placed within the cassette and process tank 10 so as to have this photoresist removed in as quick and complete way as possible.

The semiconductor wafers 20 are exposed to $DIO_3$ water 40 at ambient temperatures of between 20–21° C. The $DIO_3$ water 40 is produced by combining pure ozone gas ($O_3$) 50 from an $O_3$ generator 60 with deionized water 70 which has been previously introduced into the process tank process tank 10. Oxygen 150 is fed from oxygen source 160 to generator 60 where it is converted to ozone. The level of ozone in the $DIO_3$ water 40 is kept constant through regulation with a first gas $O_3$ sensor 80 after the generator 60. If the ozone level is high enough, it passes through the gas sensor 80 and into the process tank 10. On the other hand, if the ozone level is too low, then the ozone passes through the gas sensor 80 and into an ozonator 90 where more ozone is added until it reaches the proper level, at which time it passes into the process tank 10 under sparger plate 100. The $DIO_3$ 40 is then dispersed across the semiconductor wafers 20 via passages 110 of sparger plate 100 at an increased velocity.

The sparger plate 100 is a gas diffusion system such as that disclosed in U.S. Pat. No. 5,082,518 to Molinaro. Additional $O_3$ 50 can be added to process tank 10 via sparger plate 100. This $O_3$ 50 is thereby distributed uniformly due to the agitating effect of the sparger plate 100.

The $DIO_3$ water 40 flows from the process tank 10 back into a pump 120 after passing through a second dissolved $O_3$ sensor 130 which measures the level of concentration of $O_3$ 50 in the $DIO_3$ water 40. The recirculated $DIO_3$ water 40 passes through the pump 120 and into the filter 140 before $O_3$ 50 is added back into the $DIO_3$ water 40.

According to a theory of the invention, by increasing the fluid velocity and turbulence intensity, ozone is introduced to the wafer surface and penetrates the boundary layer. The sparger plate and tank design play a significant role to reduce the process time significantly when optimized. The removal rate depends on the fluid velocity, turbulence intensity, and ozone concentration.

In general, the sparger plate tank system of the invention is comprised of a tank, in which the wafers are submerged, having a sparger plate lying in the bottom of the tank. The $DIO_3$ water is prepared outside the tank, then pressurized via a pump to above one atmosphere and released into the tank through the sparger plate. When the $DIO_3$ water is pumped into the tank, the pressure drops to one atmosphere.

The pressure of the $DIO_3$ water directly affects the $O_3$ concentration and correspondingly affects the etch rate. The etch rate is affected by the $O_3$ concentration in the DI water which is in turn affected by the temperature and pressure of the $DIO_3$ water. The etch rate is directly affected by the velocity rate of the $DIO_3$ water.

Various modifications and alterations of this invention will become apparent to those skilled in the art without departing from the scope and spirit of this invention, and it should be understood that this invention is not limited to the illustrative embodiments set forth herein.

What is claimed is:

1. A process for removing photoresist from semiconductor wafers comprising:

positioning at least one semiconductor wafer in a process tank above a sparger plate;

introducing a mixture of ozone and deionized water to the process tank at a position below the sparger plate; and introducing the mixture of ozone and deionized water via the sparger plate at an increased flow velocity across said wafer while said wafer is submerged in said deionized water and ozone.

2. The process according to claim 1 further comprising maintaining the temperature in the processing tank at ambient temperature.

3. The process according to claim 2 wherein the temperature is about 20–21° C.

4. The process according to claim 2 wherein the temperature is above 20–21° C.

5. The process according to claim 1 wherein the mixture of ozone and deionized water is recirculated and flows back into the processing tank.

6. The process according to claim 1 wherein the mixture of deionized water and ozone is recirculated and ozone added so as to keep the concentration of ozone in said mixture about constant.

7. The process according to claim 6 wherein said mixture of deionized water and ozone is agitated via the sparger plate.

* * * * *